US012100766B2

United States Patent
Reznicek et al.

(10) Patent No.: US 12,100,766 B2
(45) Date of Patent: Sep. 24, 2024

(54) INTEGRATED SHORT CHANNEL OMEGA GATE FinFET AND LONG CHANNEL FinFET

(71) Applicant: International Business Machines Corporation, Armonk, NY (US)

(72) Inventors: Alexander Reznicek, Troy, NY (US); Oleg Gluschenkov, Tannersville, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 366 days.

(21) Appl. No.: 17/517,924

(22) Filed: Nov. 3, 2021

(65) Prior Publication Data
US 2023/0135321 A1 May 4, 2023

(51) Int. Cl.
H01L 29/76 (2006.01)
H01L 21/336 (2006.01)
H01L 21/8234 (2006.01)
H01L 27/088 (2006.01)
H01L 29/66 (2006.01)
H01L 29/78 (2006.01)

(52) U.S. Cl.
CPC .. *H01L 29/7855* (2013.01); *H01L 21/823431* (2013.01); *H01L 27/0886* (2013.01); *H01L 29/6656* (2013.01); *H01L 29/66795* (2013.01); *H01L 29/7851* (2013.01)

(58) Field of Classification Search
CPC ............ H01L 29/7855; H01L 27/0886; H01L 29/66795; H01L 29/66545; H01L 21/76243; H01L 21/7624
See application file for complete search history.

(56) References Cited

U.S. PATENT DOCUMENTS

| 6,855,588 B1 * | 2/2005 | Liao ................. H01L 29/66795 |
| | | 257/E29.151 |
| 7,728,360 B2 | 6/2010 | Chen |
| 8,119,486 B2 | 2/2012 | Kim |
| 9,184,301 B2 | 11/2015 | Bangsaruntip |

(Continued)

FOREIGN PATENT DOCUMENTS

| CN | 103928515 A | 7/2014 |
| CN | 106158974 A | 11/2016 |

OTHER PUBLICATIONS

International Search Report and Written Opinion dated Jan. 4, 2023, for International Application No. PCT/CN2022/125945, filed Oct. 18, 2022.

*Primary Examiner* — Vu A Vu
*Assistant Examiner* — Valerie N Newton
(74) *Attorney, Agent, or Firm* — Matthew Zehrer

(57) ABSTRACT

An integrated short channel omega gate FinFET and long channel FinFET semiconductor device includes a first fin and second fin on a buried oxide (BOX) layer. The BOX layer includes a fin well outside and substantially adjoining a footprint of a respective fin. A first gate dielectric layer is upon the second fin and a second gate dielectric layer is upon the first dielectric layer. The BOX layer further includes an undercut below the first fin that exposes a portion of a bottom surface of the first fin. An omega-gate is around the first fin. A tri-gate is upon the second gate dielectric layer over the second fin.

19 Claims, 15 Drawing Sheets

(56) References Cited

U.S. PATENT DOCUMENTS

| | | | |
|---|---|---|---|
| 9,691,843 B2 | 6/2017 | Cappellani | |
| 9,847,420 B2 | 12/2017 | Ranade | |
| 10,074,732 B1* | 9/2018 | Dou | H01L 29/785 |
| 10,957,779 B2 | 3/2021 | Lo | |
| 2004/0108523 A1* | 6/2004 | Chen | H01L 29/785 |
| | | | 257/202 |
| 2005/0121703 A1* | 6/2005 | Hieda | H01L 29/66795 |
| | | | 257/E21.654 |
| 2007/0090408 A1 | 4/2007 | Majumdar | |
| 2011/0062518 A1* | 3/2011 | Chan | H01L 29/66795 |
| | | | 257/E21.415 |
| 2014/0197456 A1 | 7/2014 | Wang | |
| 2015/0179766 A1 | 6/2015 | Zang | |
| 2016/0293736 A1 | 10/2016 | Cheng | |
| 2018/0358272 A1 | 12/2018 | Togo | |
| 2020/0176591 A1 | 6/2020 | Wong | |
| 2020/0279779 A1* | 9/2020 | Li | H01L 29/7827 |

* cited by examiner

INTEGRATED SHORT CHANNEL OMEGA GATE FinFET AND LONG CHANNEL FinFET

BACKGROUND

Various embodiments of the present application generally relate semiconductor device fabrication methods and resulting structures. More specifically the various embodiments relate to an integrated short channel omega gate FinFET and long channel FinFET.

SUMMARY

In an embodiment of the present invention, an integrated short channel omega gate FinFET and long channel FinFET semiconductor device is presented. The semiconductor device includes a long channel FinFET fin upon a buried oxide (BOX) layer. The semiconductor device includes a pair of long channel FinFET fin wells within the BOX layer. Each long channel FinFET fin well is outside and substantially adjoins a footprint of the long channel FinFET fin. The semiconductor device includes a first long channel FinFET gate dielectric layer upon the long channel FinFET fin and within the pair of long channel FinFET fin wells. The semiconductor device includes a long channel FinFET replacement gate structure around the long channel FinFET fin. The semiconductor device includes a short channel FinFET fin upon the BOX layer. The semiconductor device includes an undercut within the BOX layer below the short channel FinFET fin. The undercut defines a BOX layer pillar portion and exposes a portion of a bottom surface of the short channel FinFET fin. The semiconductor device includes a pair of short channel FinFET fin wells. Each short channel FinFET fin well is outside and substantially adjoins a respective sidewall of the BOX layer pillar portion. The semiconductor device includes a short channel FinFET replacement gate structure around the short channel FinFET fin.

In an embodiment of the present invention, a semiconductor device is presented. The semiconductor device includes a first fin upon a buried oxide (BOX) layer and a second fin upon the BOX layer. The semiconductor device includes an undercut within the BOX layer below the first fin. The semiconductor device includes an omega-gate upon an upper surface of the first fin, upon a first sidewall of the first fin, upon a second opposing sidewall of the first fin, and upon a portion of a bottom surface of the first fin that is exposed by the undercut. The semiconductor device includes a tri-gate upon an upper surface of the second fin, upon a first sidewall of the second fin, and upon a second opposing sidewall of the second fin.

In another embodiment of the present invention, a semiconductor device fabrication method is presented. The method includes forming a first fin and second fin upon a buried oxide (BOX) layer. The method includes forming a first pair of fin wells within the BOX layer. Each of the first pair of fin wells is outside and substantially adjoins a footprint of the first fin. The method includes forming a second pair of fin wells within the BOX layer. Each of the second pair of fin wells is outside and substantially adjoins a footprint of the second fin. The method includes forming a first gate dielectric upon the first fin, upon the first pair of fin wells, upon the second fin, and upon the second pair of fin wells. The method includes removing the first gate dielectric that is upon the first fin and that is upon the first pair of fin wells, while retaining the first gate dielectric that is upon the second fin and that is upon the second pair of fin wells. The method includes forming an undercut within the BOX layer below the first fin. The method includes forming an omega-gate structure upon and around the first fin and forming a tri-gate structure upon the first gate dielectric over the second fin.

These and other embodiments, features, aspects, and advantages will become better understood with reference to the following description, appended claims, and accompanying drawings.

DETAILED DESCRIPTION

Figure 1:
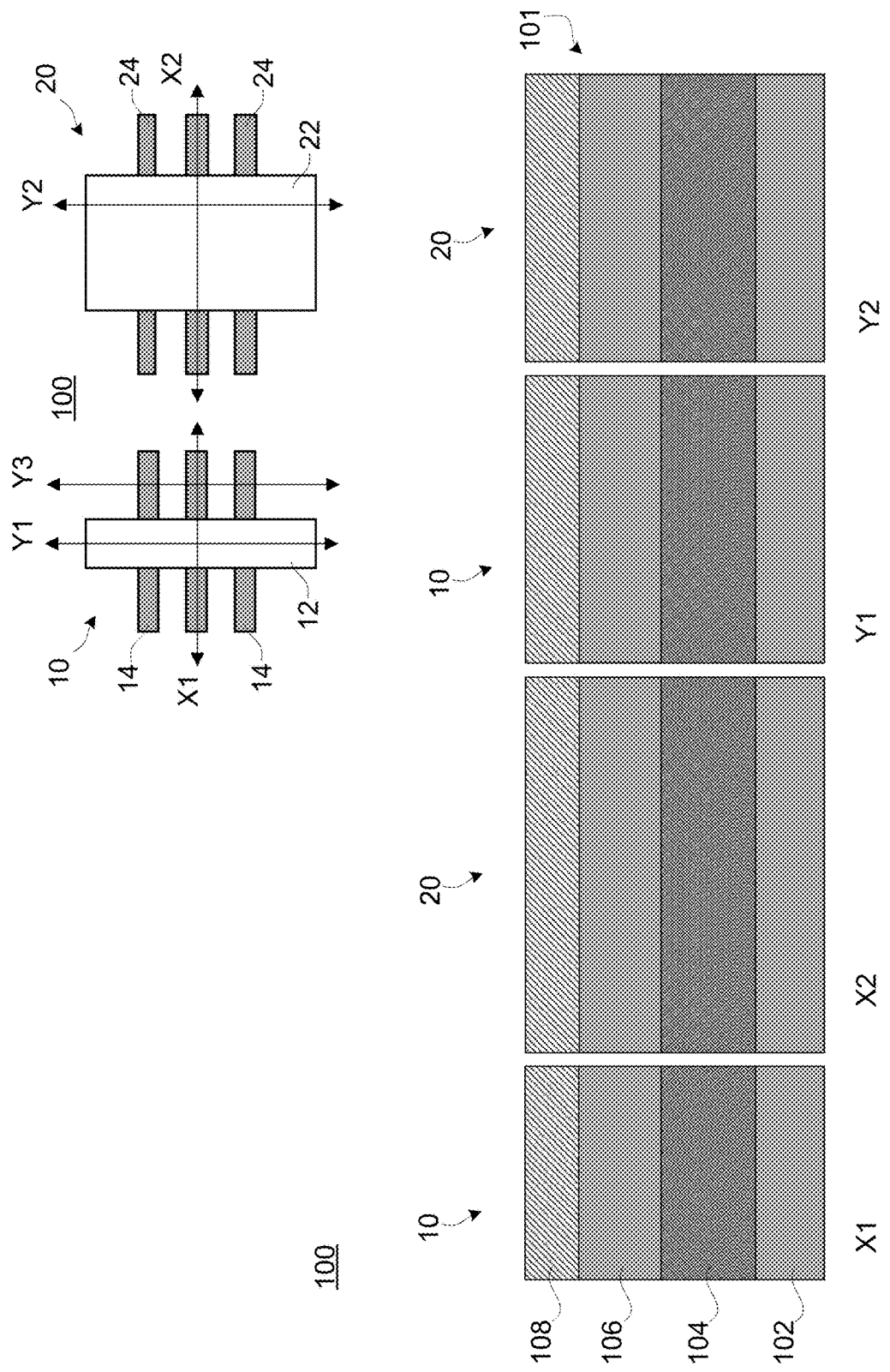
FIG. 1 through FIG. 14 depicts cross-sectional views of a semiconductor structure shown after a fabrication operation, in accordance with one or more embodiments.

It is understood in advance that although a detailed description is provided herein of an exemplary FET architecture having an integrated short channel device with an omega gate and a long channel device, implementation of the teachings recited herein are not limited to the particular FET architecture described herein. Rather, embodiments of the present invention are capable of being implemented in conjunction with any other appropriate type of FET device now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element,"

means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, or ±2% difference between the coplanar materials.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate. The gate and the body are spaced apart by a gate dielectric layer. The channel connects the source and the drain, and electrical current flows through the channel from the source to the drain. The electrical current flow is induced in the channel region by a voltage applied at the gate.

Referring to FIG. 1 that depicts a semiconductor device 100 which includes an integrated short channel FET 10 and a long channel FET 20. Short channel FET 10 includes fins 14 and gate 12. Long channel FET 20 includes fins 24 and gate 22. The width of gate 12, in the X direction, is smaller than the respective width of gate 22. Therefore, gate 12 may be referred herein as a short gate and gate 22 may be referred herein as a long gate. Various cross-sectional planes X1, X2, Y1, Y2, and Y3 of semiconductor device 100 are defined as depicted. These planes and may be referenced in the cross-sectional views of semiconductor device 100 at various fabrication stages, as depicted in FIG. 1 through FIG. 13.

FIG. 1 depicts cross-sectional views of a semiconductor device 100 shown after an initial fabrication operation, in accordance with one or more embodiments. The initial fabrication operations may include forming or otherwise providing a substrate 101.

Non-limiting examples of suitable materials for the substrate 101 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). As depicted, the substrate 101 can be a semiconductor on insulator (SOI) substrate that includes a base substrate layer 102, a buried oxide (BOX) layer 104 on the base substrate layer 102, and an upper semiconductor layer 106 upon the BOX layer 104.

A mask 108 may be formed upon the substrate 101. For example, mask 108 may be formed as a blanket layer upon the upper semiconductor layer 106. The mask 108 may be formed by deposition of mask material(s) or layer(s) of mask material(s) upon a top surface of substrate 101. In a particular embodiment, mask 108 may be a hard mask. Exemplary mask 108 materials may be silicon nitride (SiN), a combination of SiN and Silicon Dioxide (SiO$_2$), or the like.

Figure 2:
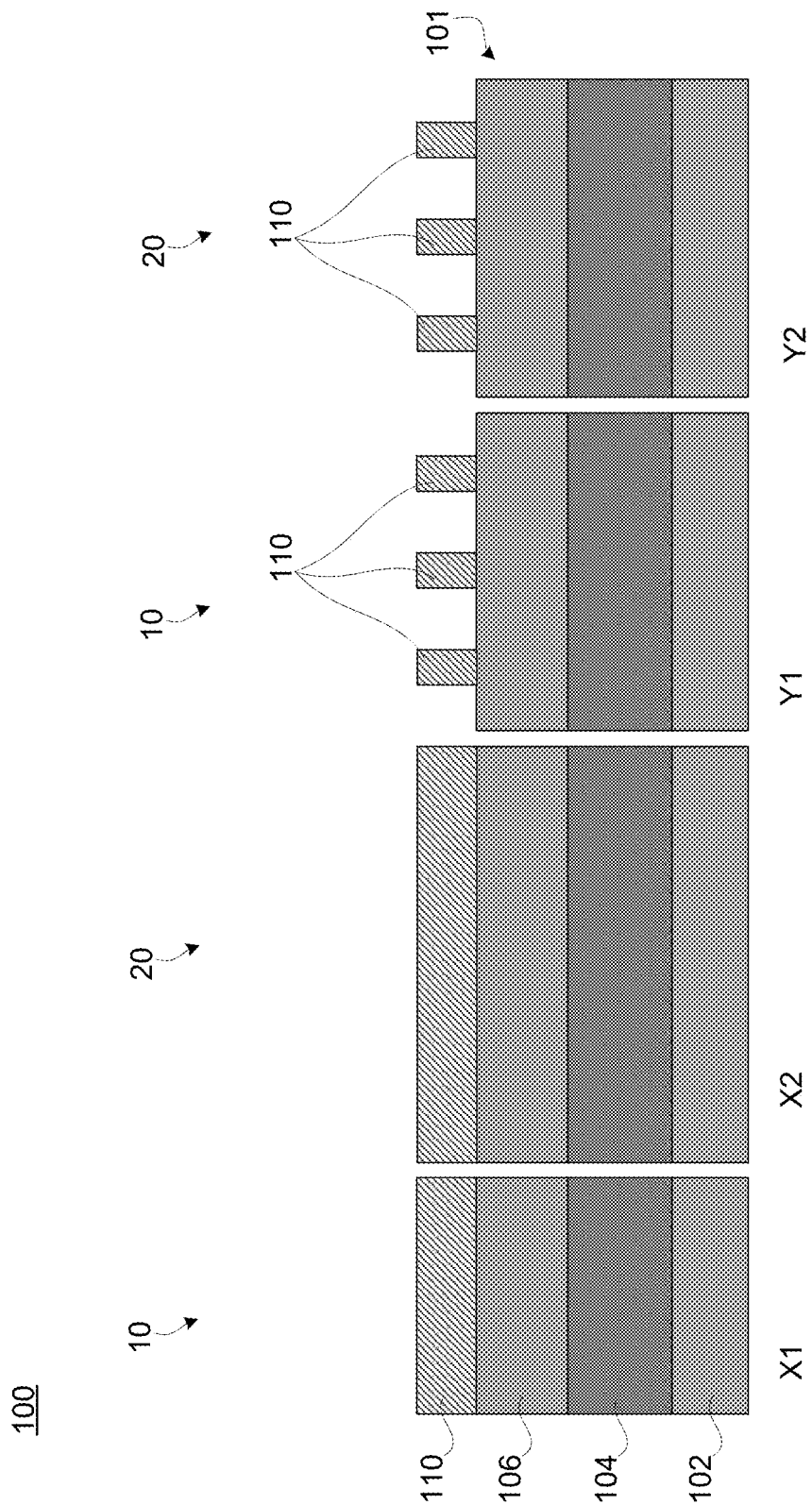

FIG. 2 depicts cross-sectional views of a semiconductor device 100 shown after a fabrication operation, in accordance with one or more embodiments. The current fabrication operation may include patterning mask 108 to formed patterned mask 110. The mask 108 may be patterned by removing undesired portions thereof while retaining desired portions thereof. The portions of patterned mask 110 may effectively protect underlying regions of the substrate 101 while the removed portions of mask 108 may expose underlying regions of the substrate 101. The mask 108 may be patterned by known lithography, etching, or other removal techniques. The mask 108 can be patterned by conventional patterning techniques, such as Self-Aligned Double Patterning (SADP), Self-Aligned Triple Patterning (SATP), Self-Aligned Quadruple Patterning (SAQP), or the like.

Figure 3:
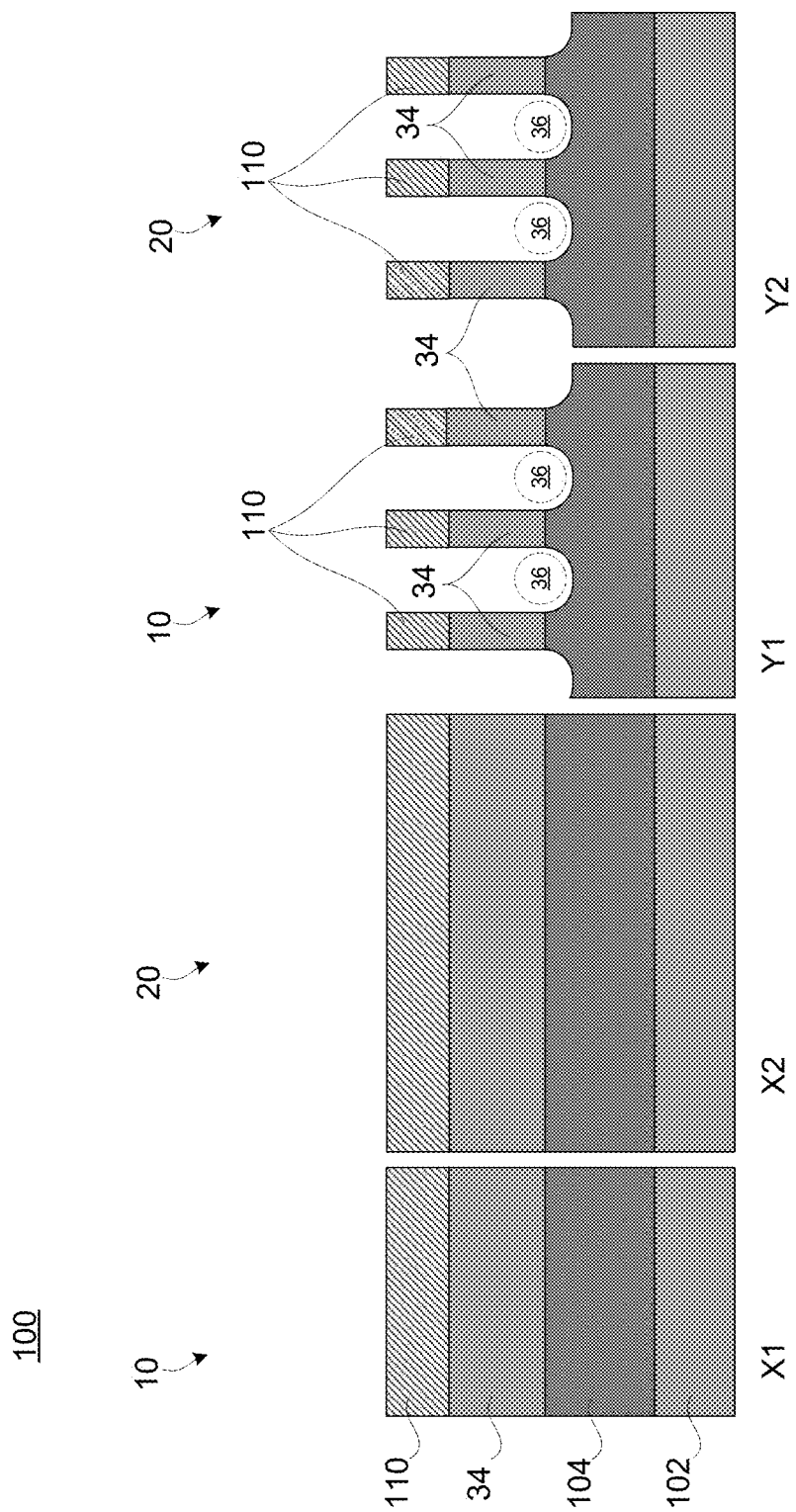

FIG. 3 depicts cross-sectional views of a semiconductor device 100 shown after a fabrication operation, in accordance with one or more embodiments. The current fabrication operation may include forming one or more fins 34 and one or more fin wells 36 outside and substantially adjoining the footprint of the fin 34. The one or more fins 34 may include one or more fins 12 of short channel device 10, when associated with the Y1 or the Y3 cross-section, or may include one or more fins 22 of long channel device 10, when associated with the Y2 cross-section.

As fins 34 may be formed from subtracting material(s) from substrate 101, fins 34 may retain the material properties (e.g., dopants, or the like) therefrom. For example, fins 34 may retain the material properties of the regions of upper semiconductor layer 106 that are protected by patterned mask 110 there above.

In an alternative implementation, utilizing known deposition techniques, fins 34 may be formed upon or from substrate 101. For example, fins 34 could be positively formed upon BOX layer 104 by known deposition techniques such PVD, CVD, ALD, Epitaxial growth, or the like.

Utilizing known patterning, lithography, etching, etc. techniques, undesired portions of the substrate 101 may be removed, thereby forming fin wells 36, while desired portions thereof may be retained. For example, the patterning process may partially remove or gouge a portion(s) of BOX layer 104 that is outside and substantially adjoining the footprint of fin 34, thereby forming fin well 36. In some embodiments, fin well 36 may connect neighboring fins 34. That is, a single fin well 34 may be located outside and at least substantially adjoined to the footprint of a first fin 34 and at least substantially adjoined to the footprint of a neighboring second fin 34. In some embodiments, at the present stage of fabrication, fin well 36 does not undercut an associated fin 34. For example, a retained portion of BOX layer 104 is below a full width of fin 34, as is depicted in the Y1 and Y2 cross-sectional views. Further, in some embodiments, fin well 36 has arced, circular, elliptical, concave, or the like, wall(s), surface(s), or the like. For example, fin well 36 may have concave rounded inward sloped surface(s), like the inside of a bowl.

Figure 4:
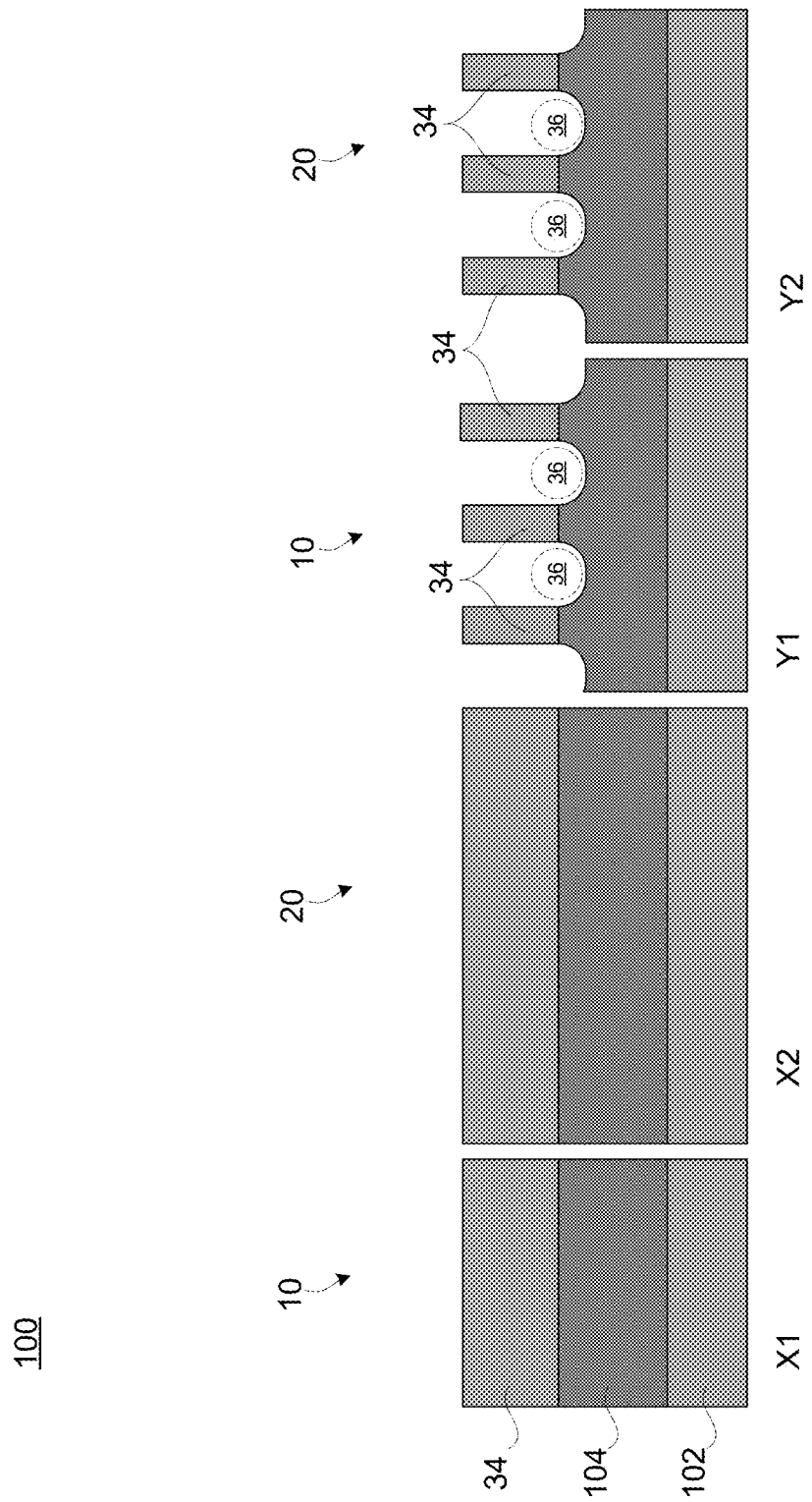

FIG. 4 depicts cross-sectional views of a semiconductor device 100 shown after a fabrication operation, in accordance with one or more embodiments. The current fabrication operation may include removing patterned mask 110. Patterned mask 110 may be removed by known removal techniques, such as, selective dry or wet etch processes, or the like.

Figure 5:
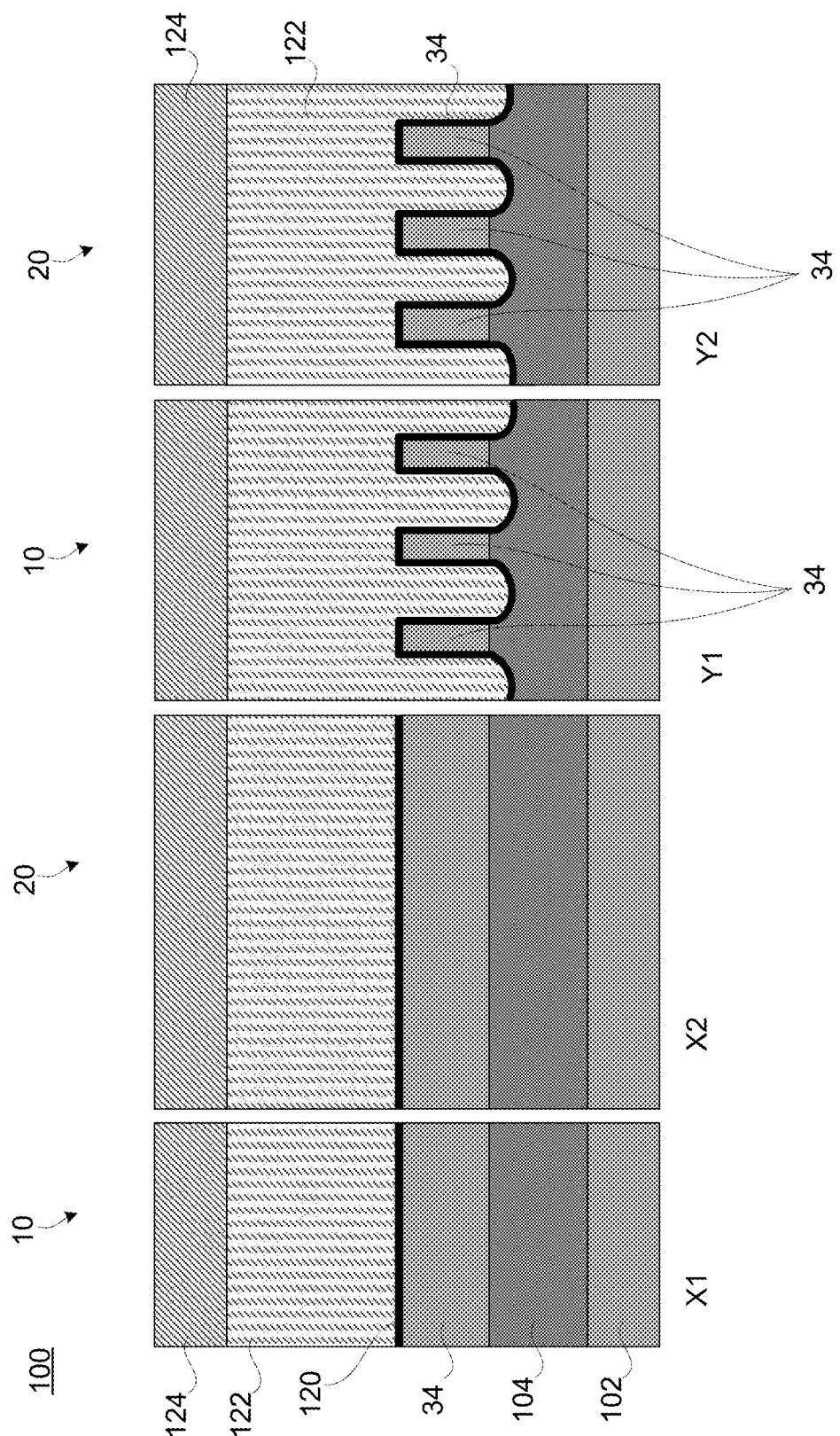

FIG. 5 depicts cross-sectional views of a semiconductor device 100 shown after a fabrication operation, in accordance with one or more embodiments. The current fabrication operation may include forming gate dielectric layer 120, forming sacrificial gate layer 122, and forming gate mask layer 124.

Gate dielectric layer 120 may be formed upon BOX layer 104, formed upon fin well 36 arced wall(s), and formed upon and around fins 34. The gate dielectric layer 120 may be formed by known deposition techniques such PVD, CVD, ALD, or the like. Gate dielectric layer 120 may be an oxide, such as $SiO_2$, SiN, SiON, SICN, SIOCN, or the like. The gate dielectric layer 120 can have a thickness of from about 2 nm to about 8 nm, although other thicknesses are within the contemplated scope.

Gate dielectric layer 120 may be the blanket layer in which a retained sacrificial portion thereof separates the channel region 143 of the fin 34 from the sacrificial gate 132, which prevents the fin 34 damage during eventual sacrificial gate 132 removal process, and in which a retained portion thereof serves as part of the replacement gate structure 195 of the long channel FET 20. Often long channel FETs 20 can be used in applications, like IO devices, or the like that require higher operating voltage. Therefore, a thicker gate dielectric structure or layer(s) within the final long channel FET 20 replacement gate structure 195 may be advantageous, as compared to thickness of a gate dielectric structure or layer(s) within the final replacement gate structure 194 of short channel FET 10.

Sacrificial gate layer 122 may be formed upon gate dielectric layer 120. Sacrificial gate layer 122 may be formed by known deposition techniques such PVD, CVD, ALD, or the like. Sacrificial gate layer 122 may be formed to a thickness greater than the height of fins 34. For example, the top surface of the sacrificial gate layer 122 may be above the top surface of fins 32. The sacrificial gate 120 material layer can have a thickness of from about 30 nm to about 200 nm, although other thicknesses are within the contemplated scope.

Gate mask layer 124 may be formed upon the sacrificial gate layer 122. Gate mask layer 124 may be a hard mask layer. Exemplary gate mask layer 124 materials may be SiN, $SiO_2$, a combination of SiN and $SiO_2$, SiON, SICN, SIOCN, or the like. Gate mask layer 124 may be formed by known deposition techniques such PVD, CVD, ALD, or the like. Gate mask layer 124 can have a thickness of from about 5 nm to about 200 nm, although other thicknesses are within the contemplated scope.

Figure 6:
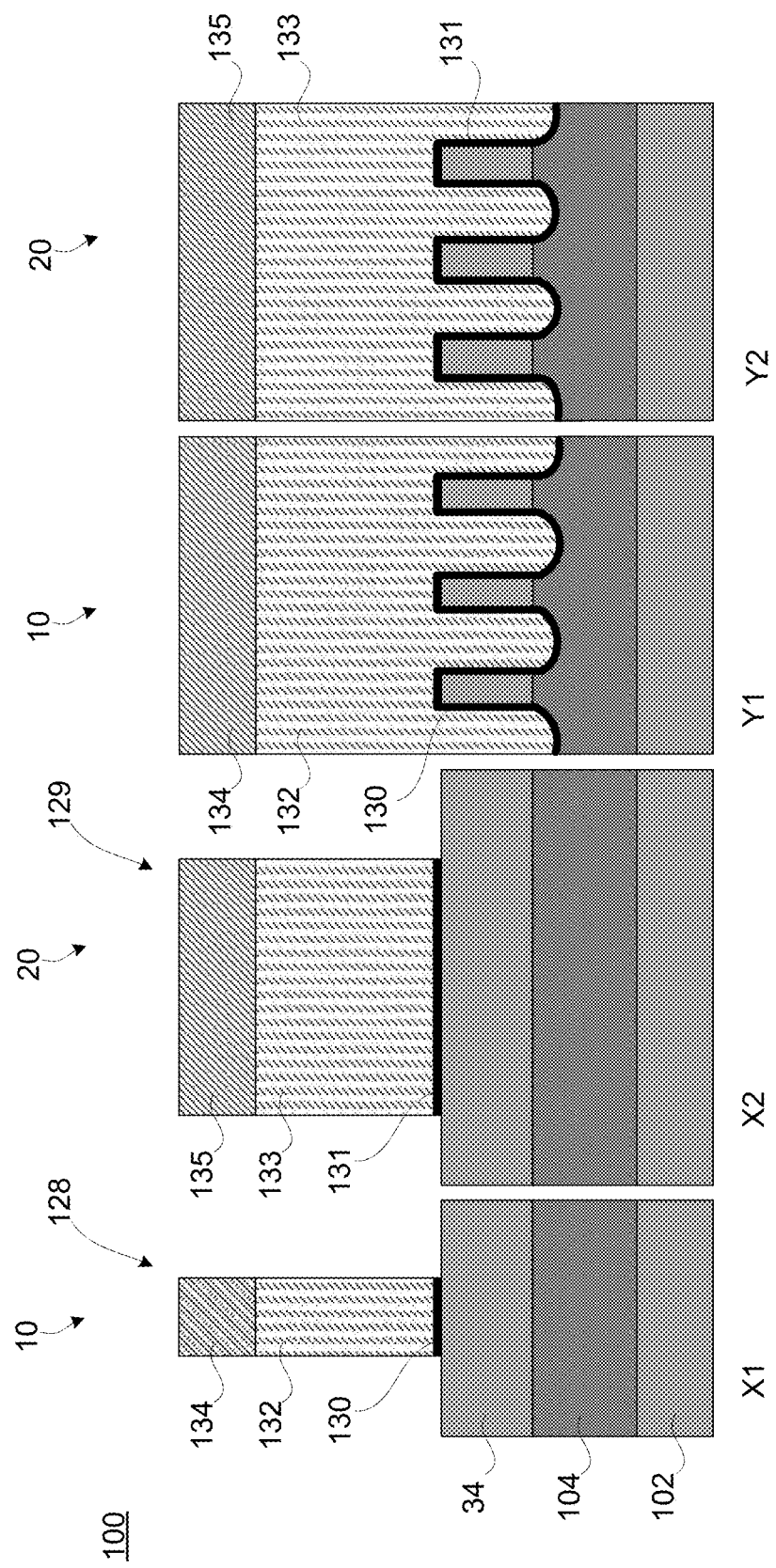
Figure 7:
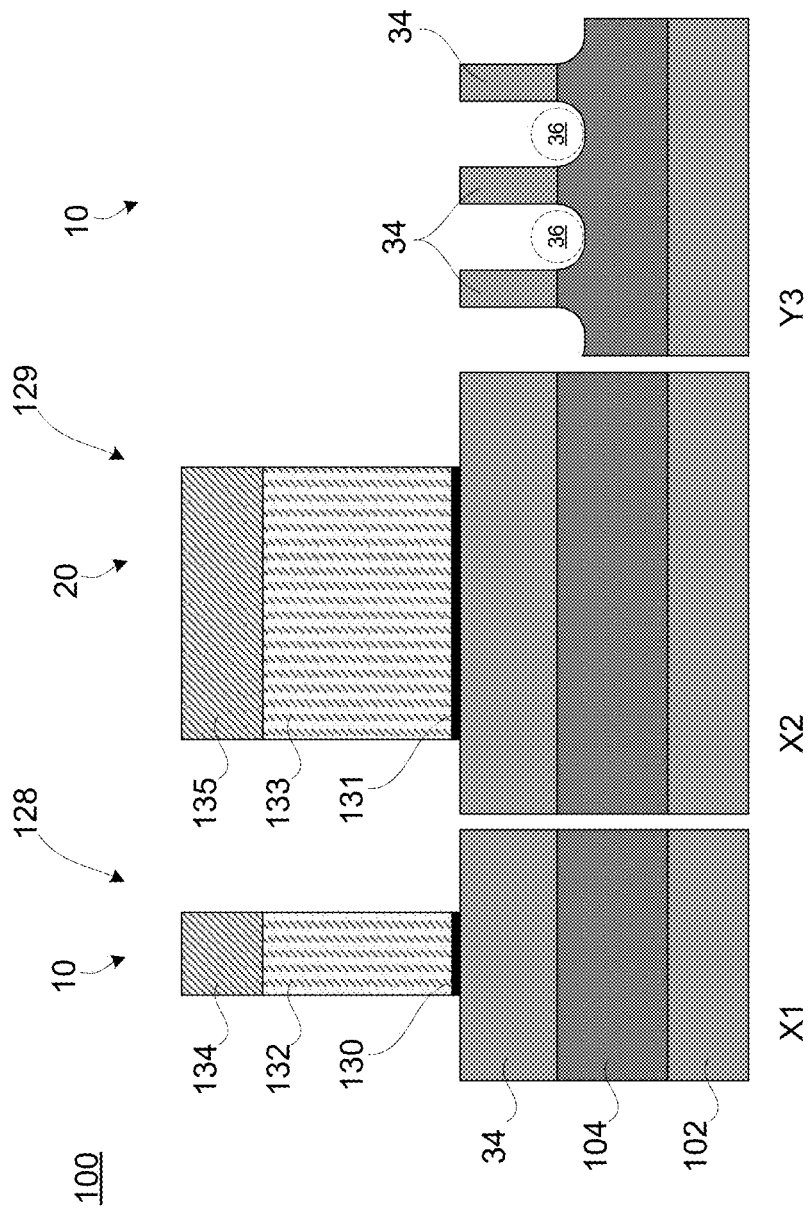

FIG. 6 and FIG. 7 depicts cross-sectional views of a semiconductor device 100 shown after a fabrication operation, in accordance with one or more embodiments. The current fabrication operation may include forming sacrificial gate structure 128 of short channel FET 10 and forming sacrificial gate structure 129 of long channel FET 20.

Sacrificial gate structure 128 and sacrificial gate structure 129 may be formed by utilizing known patterning, lithography, etching, etc. techniques, to remove undesired portions of gate mask layer 124, thereby forming gate mask 134, 135, followed by further removal of sacrificial gate layer 122 material and gate dielectric layer 120 that is not covered by an associated gate mask 134, 135. Desired portions of sacrificial gate layer 122 thereunder may be retained, thereby forming sacrificial gate 132, 133. Further, desired portions of gate dielectric layer 120 thereunder may also be retained, thereby forming gate dielectric 130, 131. These retained portions of sacrificial gate layer 122 may respectively form sacrificial gate 132, 133 with a gate mask 134, 135 thereupon. Similarly, the retained portions of gate deictic layer 120 may respectively form gate dielectric 130, 131 between the sacrificial gate 132, 133 and fins 34.

The combined structure of gate dielectric 130, sacrificial gate 132, and the associated gate mask 134 may be referred herein as sacrificial gate structure 128. Similarly, the combined structure of gate dielectric 131, sacrificial gate 133, and the associated gate mask 135 may be referred herein as sacrificial gate structure 129.

In some implementations, the arced wall(s) or surface(s) that define the bottom profile of fin well 36 (i.e., BOX layer 104 surface(s) of fin well 36) may allow for a more adequate, more fully complete, or total, etc., removal of sacrificial gate layer 122 material therefrom.

Figure 8:
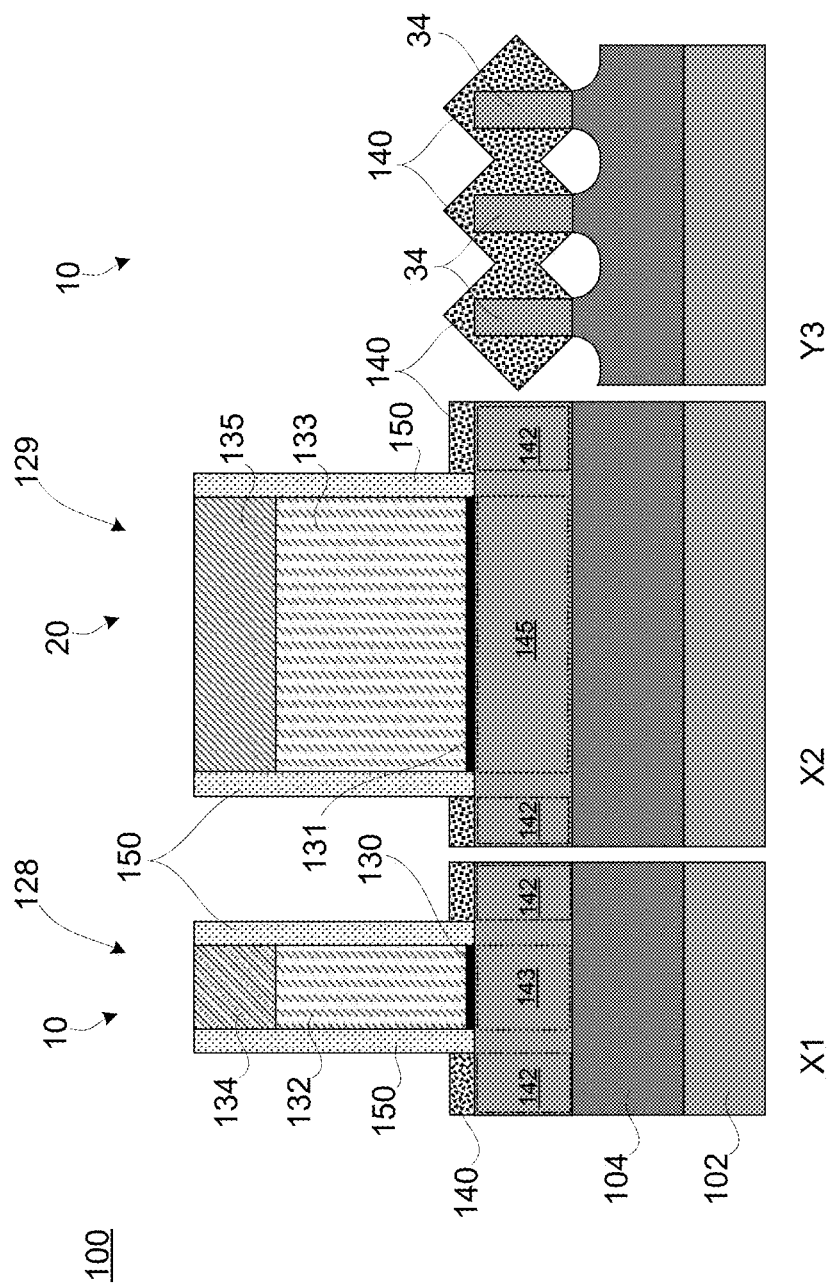

FIG. 8 depicts cross-sectional views of a semiconductor device 100 shown after a fabrication operation, in accordance with one or more embodiments. The current fabrication operation may include forming source and/or drain (S/D) regions 140 and forming gate spacers 150.

Gate spacers 150 may be formed upon sidewalls or side surfaces of sacrificial gate structures 128, 129. Gate spacers 150 may also be formed generally around fins 34 and upon a portion of BOX layer 104. Exemplary gate spacers 150 materials may be SiN, SiO$_2$, a combination of SiN and SiO$_2$, SiON, SiCN, SiOCN, SiBCN, SiOC, or the like. Gate spacers 150 may be formed by known deposition techniques such PVD, CVD, ALD, followed by an anisotropic spacer RIE, or the like and can have a thickness (e.g., from the sidewall of the sacrificial gate structure, etc.) of from about 4 nm to about 15 nm, although other thicknesses are within the contemplated scope.

S/D regions 140 may be formed by epitaxially growing one layer and then the next until the desired number and desired thicknesses of such layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methyl silane, dimethylsilane, ethyl silane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium, and argon can be used.

In a particular implementation, as is exemplarily depicted in the Y3 cross-section, fin 34 sidewalls have a {110} orientated crystalline surface and epitaxial growth of S/D region 140 material therefrom may occur to form a diamond like structure around the fin 32. The outside of the diamond like structure has a {111} orientated crystalline surface. During epitaxial growth, S/D region 140 material grows on the diamond like structure {111} orientated crystalline surface or the fin 34 sidewalls have a {110} orientated crystalline surface until neighboring diamond like structures merge. When respective tips of two neighboring diamonds merge, another {110} orientated crystalline surface(s) is formed therebetween and further epitaxial growth therefrom may occur. In some embodiments, S/D region 140 formation may occur subsequent to recessing one or more fins 34.

The fin 34 generally surrounded by S/D region 140 may form a respective fin S/D region. The fin 34 may have a channel region between the associated S/D regions 140. For example, short channel device 10 may include a short channel region 143 between fin source region 142 and fin drain region 142 and long channel device 20 may include a long channel region 145 between fin source region 142 and fin drain region 142. The length of long channel region 145 (i.e., the distance between associated S/D regions 142) is generally greater than the length of short channel region 143 (i.e., the distance between associated S/D regions 142). The length of short channel region 143 may be 10 nm to about 25 nm, although other widths are within the contemplated scope. The length of long channel region 145 may be 40 nm to about 300 nm, although other lengths are within the contemplated scope.

Figure 9:
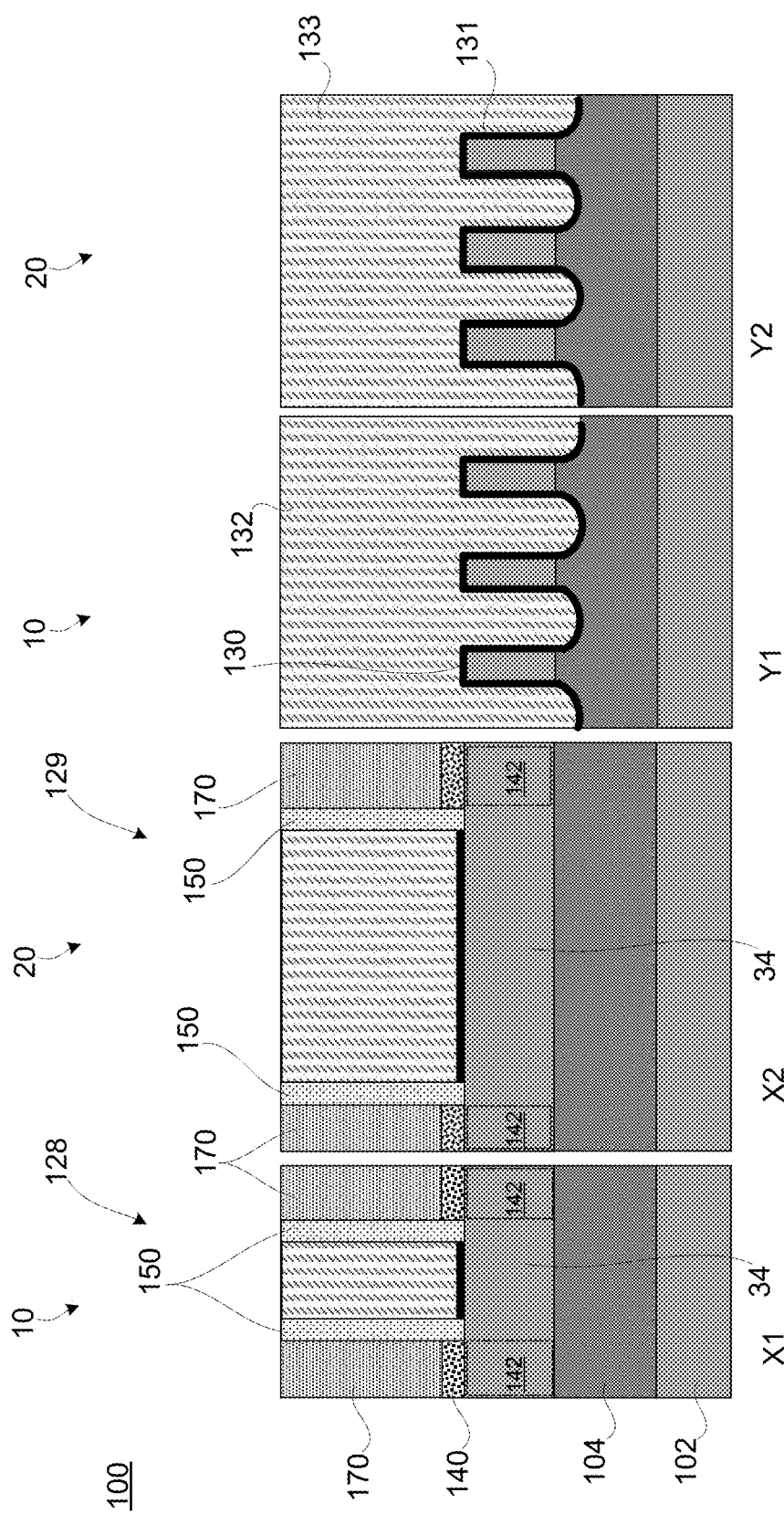

FIG. 9 depicts cross-sectional views of a semiconductor device 100 shown after a fabrication operation, in accordance with one or more embodiments. The current fabrication operation may include forming inter-layer dielectric (ILD) 170 upon and around S/D regions 142 and upon BOX layer 104.

ILD 170 may be formed by known deposition techniques such PVD, CVD, ALD, or the like. ILD 170 may be a dielectric material, such as SiO$_2$, SiN, SiON, SiCN, SiOCN, or the like. ILD 170 may be formed to a thickness greater than the height of sacrificial gate structures 128, 129. Subsequently, excess ILD 170 portions, gate spacer 150 portions, and gate mask 134, 135 may be removed or planarized by a CMP. This removal process may fully remove the gate mask 134 and the gate mask 135 so as to expose the sacrificial gate 132 and the sacrificial gate 133, there below. As such, the top surfaces of the exposed sacrificial gate 132, the exposed sacrificial gate 133, gate spacers 150, and ILD 170 may be coplanar.

Figure 10:
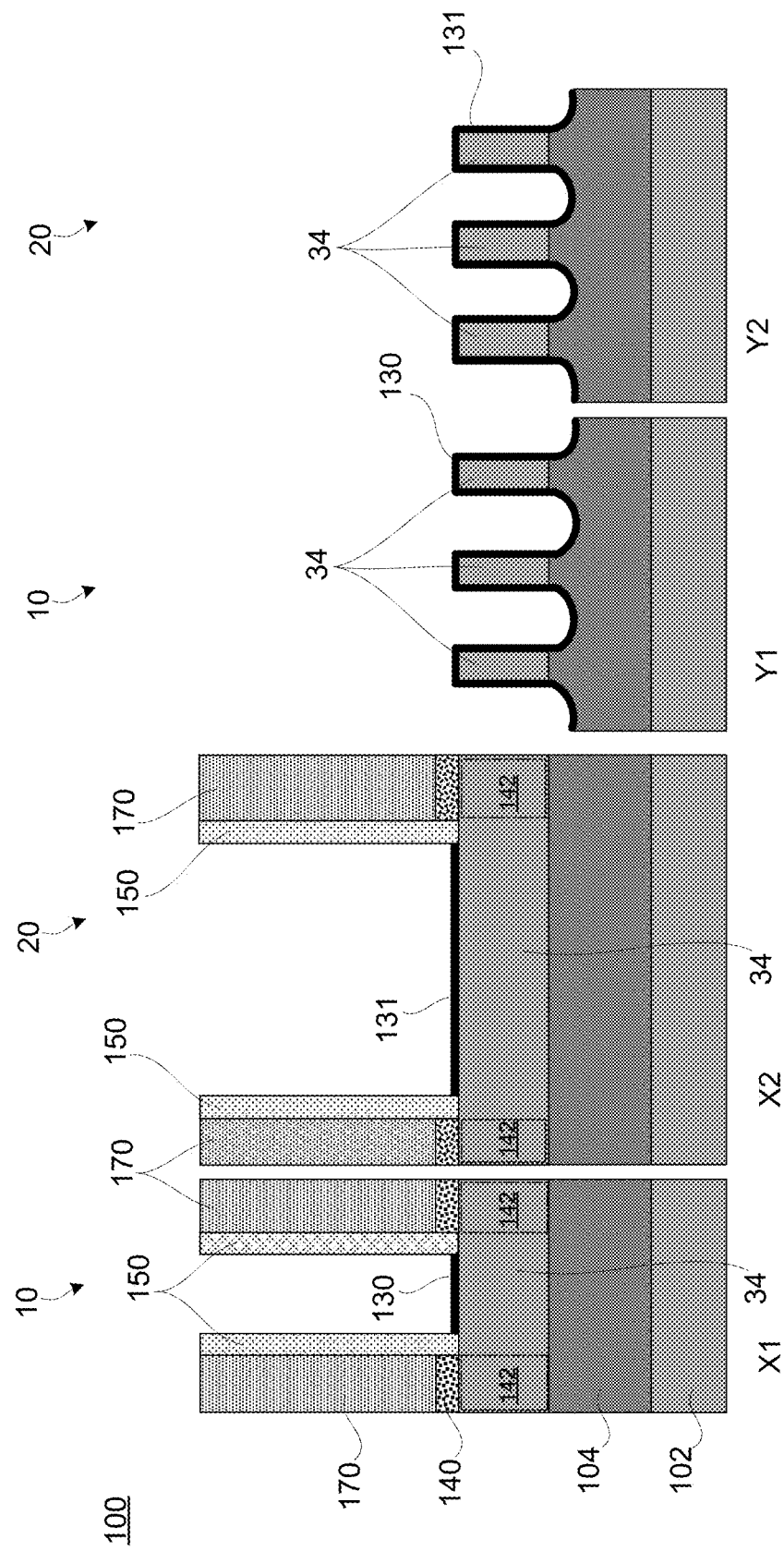

FIG. 10 depicts cross-sectional views of a semiconductor device 100 shown after a fabrication operation, in accordance with one or more embodiments. The current fabrication operation may include removing sacrificial gate 132 and removing sacrificial gate 133.

Removal of sacrificial gate 132 and sacrificial gate 133 may be accomplished by known removal techniques such as etching, etc. The removal of sacrificial gate 132 may expose the inner facing sidewalls of its associated spacer 150 and may further expose the gate dielectric 130 internal thereto. Similarly, removal of sacrificial gate 133 may expose the inner facing sidewalls of its associated spacer 150 and may further expose the gate dielectric 131 internal thereto.

Figure 11:
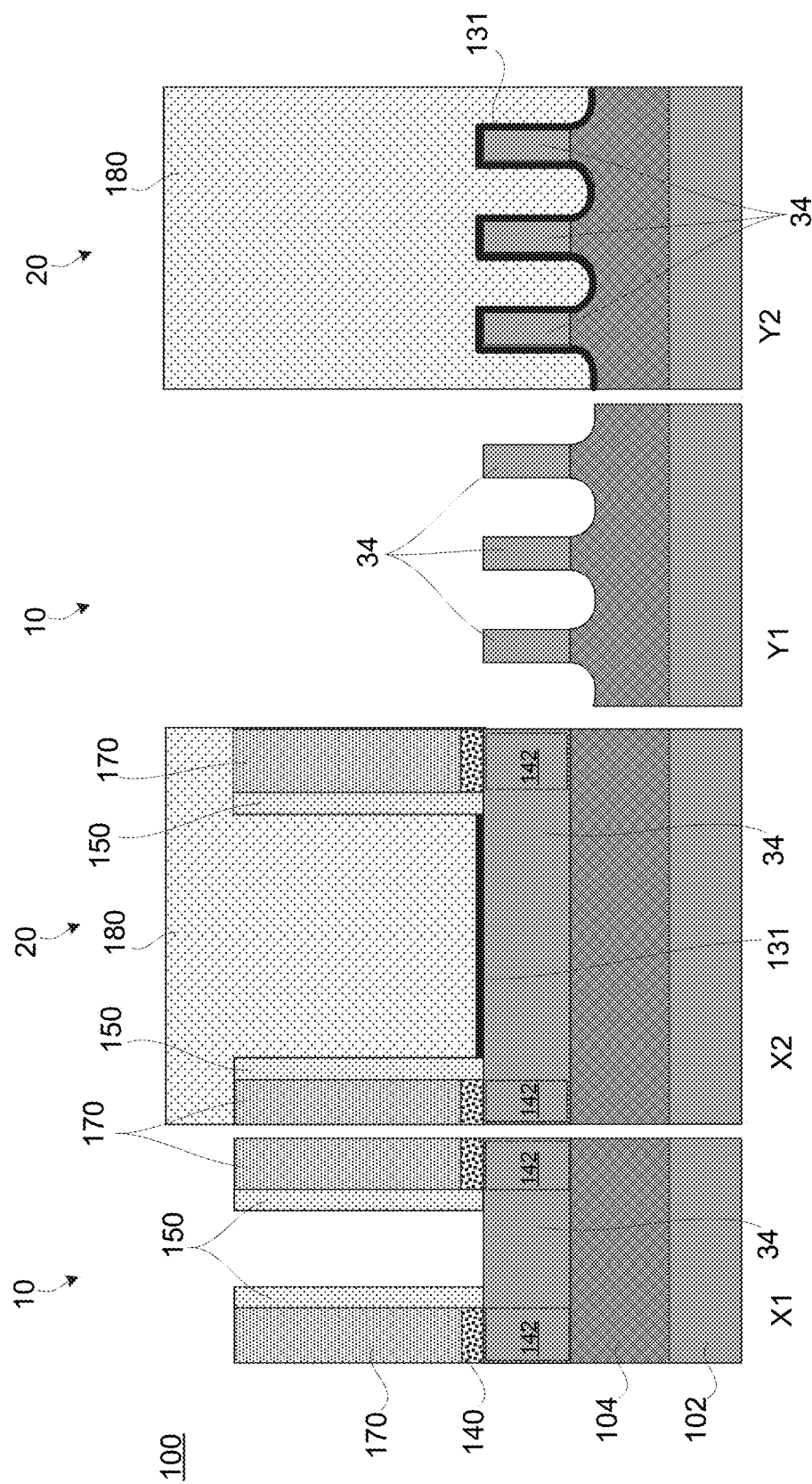

FIG. 11 depicts cross-sectional views of a semiconductor device 100 shown after a fabrication operation, in accordance with one or more embodiments. The current fabrication operation may include preserving the gate dielectric 131 within long channel FET 20 and removing gate dielectric 130 in short channel FET 10.

Mask 180 may be formed by known deposition techniques such spin-on coating, or the like. Mask 180 may be a sacrificial material, and/or temporary material, such as an organic planarization layer, or the like. Mask 180 may be formed to a thickness greater than the height of ILD 170. Mask 180 may protect gate dielectric 131 within long channel device 20 from gate dielectric 130 removal process(es), so as to retain gate dielectric 131. After mask layer 180 is deposited, patterning techniques may be used to remove the mask layer 180 from short channel FET 10.

Removal of gate dielectric 130 may be accomplished by known removal techniques and may expose sidewalls and top surface of fins 34 internal to spacer 150 within short channel FET 10. Similarly, removal of gate dielectric 130 may expose BOX layer 104 internal to spacer 150 within short channel FET 10.

Figure 12:
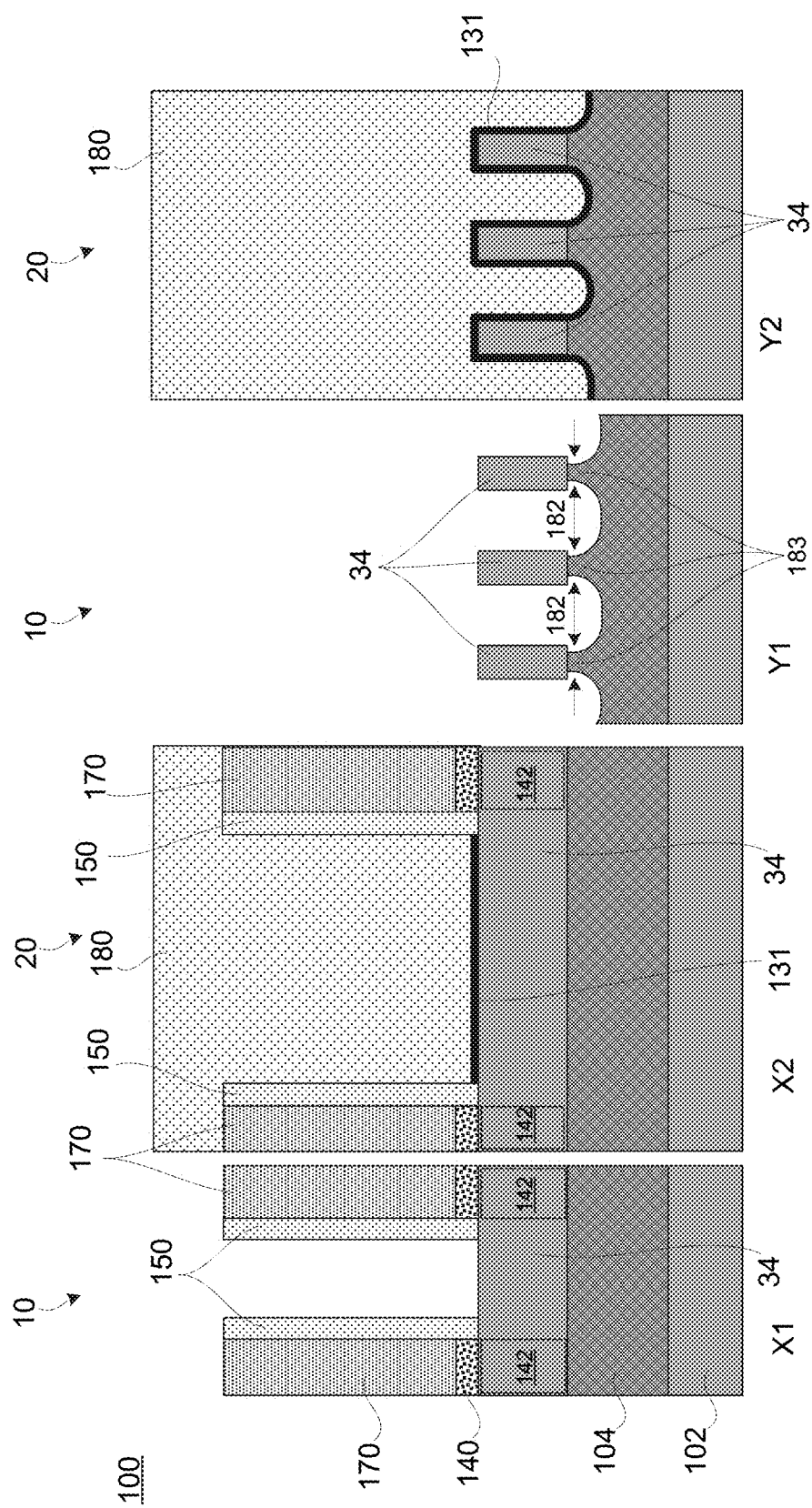

FIG. 12 depicts cross-sectional views of a semiconductor device 100 shown after a fabrication operation, in accordance with one or more embodiments. The current fabrication operation may include forming undercut 182 below fins 34 within short channel FET 10.

Forming undercut 182 may be accomplished by known removal techniques and may remove portions of BOX layer 104 directly below fins 34 within short channel FET 10. As such, undercut 182 may expose a portion(s) of the bottom surface of fin 34 within short channel FET 10. For example, undercut 182 may expose an outside region of the bottom surface of fin 34 when an inside region of the bottom surface of fin 34 remains upon and/or connected to a pillar 183 portion of BOX layer 104, as depicted. The exposed portion(s) of the bottom surface of fin 34 may be an exposed perimeter portion around the outside bottom surface perimeter of fin 34.

Pillar 183 portion of BOX layer 104 may be effectively formed of undercut 182 BOX layer 104 material that is between neighboring fin wells 36. The pillar 183 may be centrally aligned with the fin 34 there above. The arced sidewall(s) of fin well 36 below fin 34 may be advantageous in the formation of undercut 182. For example, due to the presence of fin well 36, a relatively short duration BOX layer 104 isotropic etch can create undercut 182 underneath the fins 34. Without the presence of fin well 36, a relatively large duration BOX layer 104 isotropic may be required to create such an undercut, which may cause BOX layer 104 material loss, e.g., under spacer 150, that would negatively impact semiconductor device 100 performance and may undesirably increase parasitic capacitance.

Formation of undercut 182 may be accomplished by known removal techniques. For example, undercut 182 may be formed by an etching, cleaning, or other known removal technique. For clarity, due to fins 34 within long channel device 20 being protected by e.g., mask 180, undercut 182 may not be formed thereunder. In other words, undercut 182 may be formed solely within short channel FET 10, as depicted.

Figure 13:
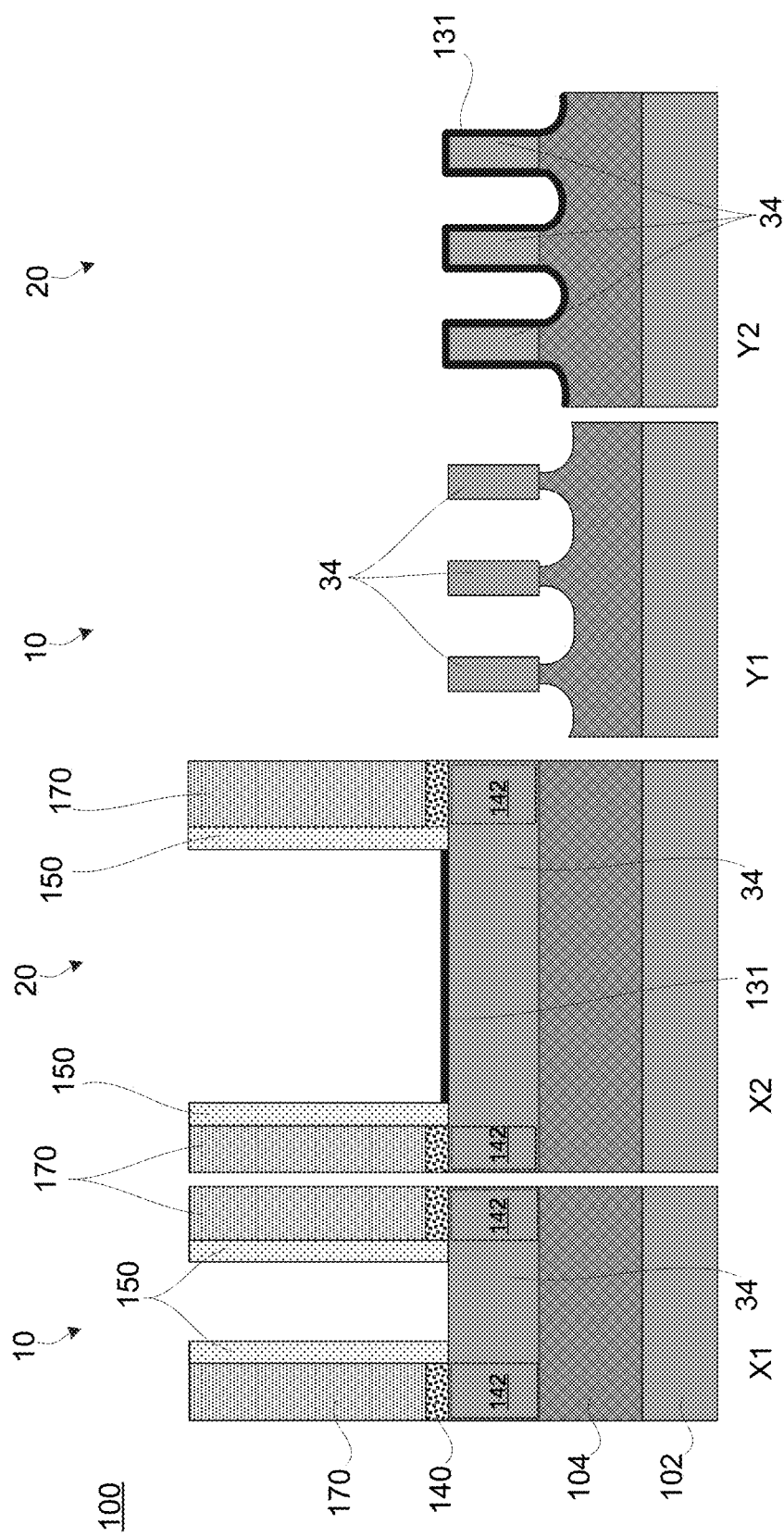

FIG. 13 depicts cross-sectional views of a semiconductor device 100 shown after a fabrication operation, in accordance with one or more embodiments. The current fabrication operation may remove mask 180. Removal of mask 180 may be accomplished by known removal techniques, such as etching, an OPL (Organic Planarization Layer) ash, or the like, and may expose ILD 170, spacer 150, and gate dielectric 131 within long channel FET 20.

Figure 14:
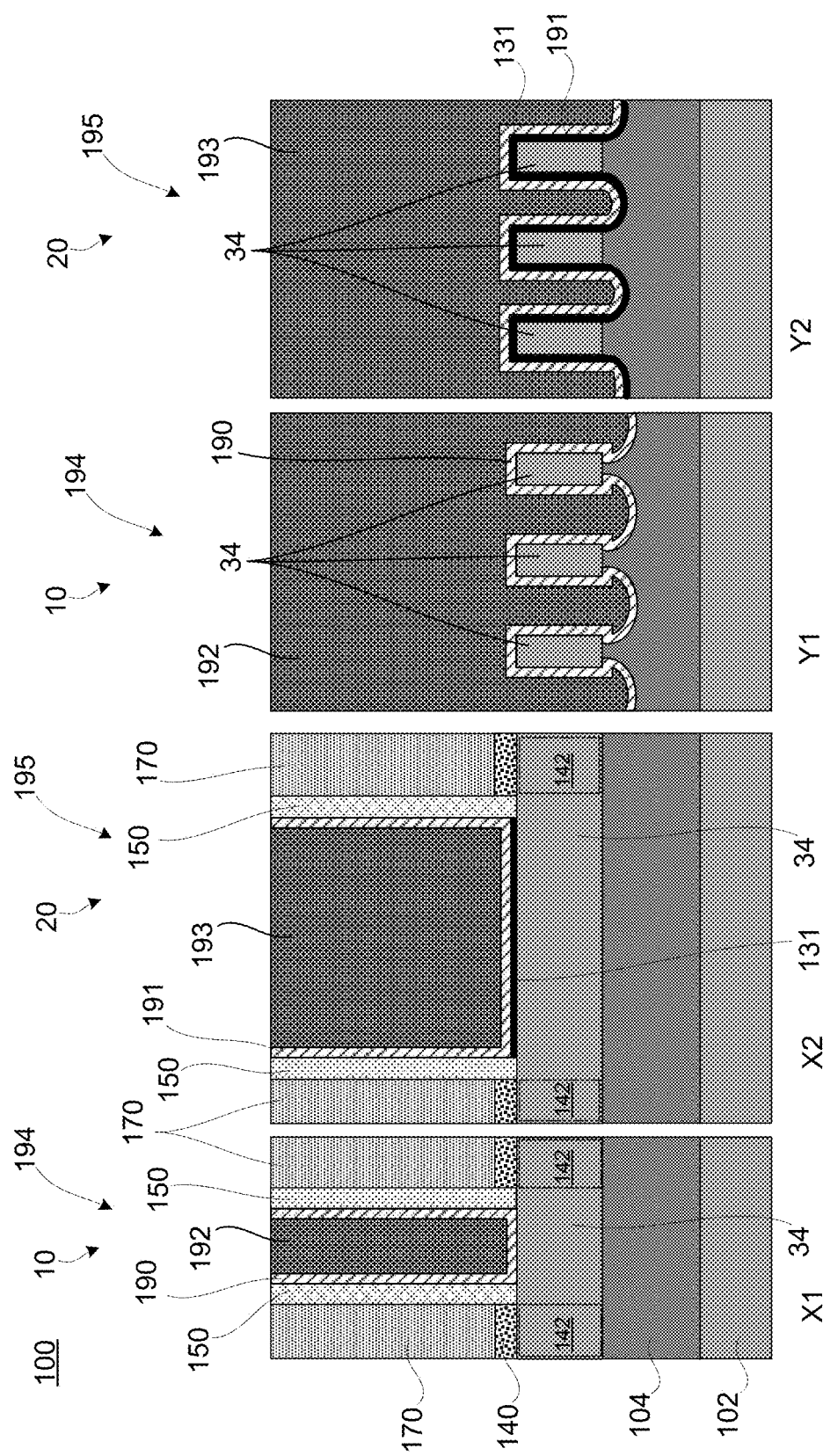
Figure 15:
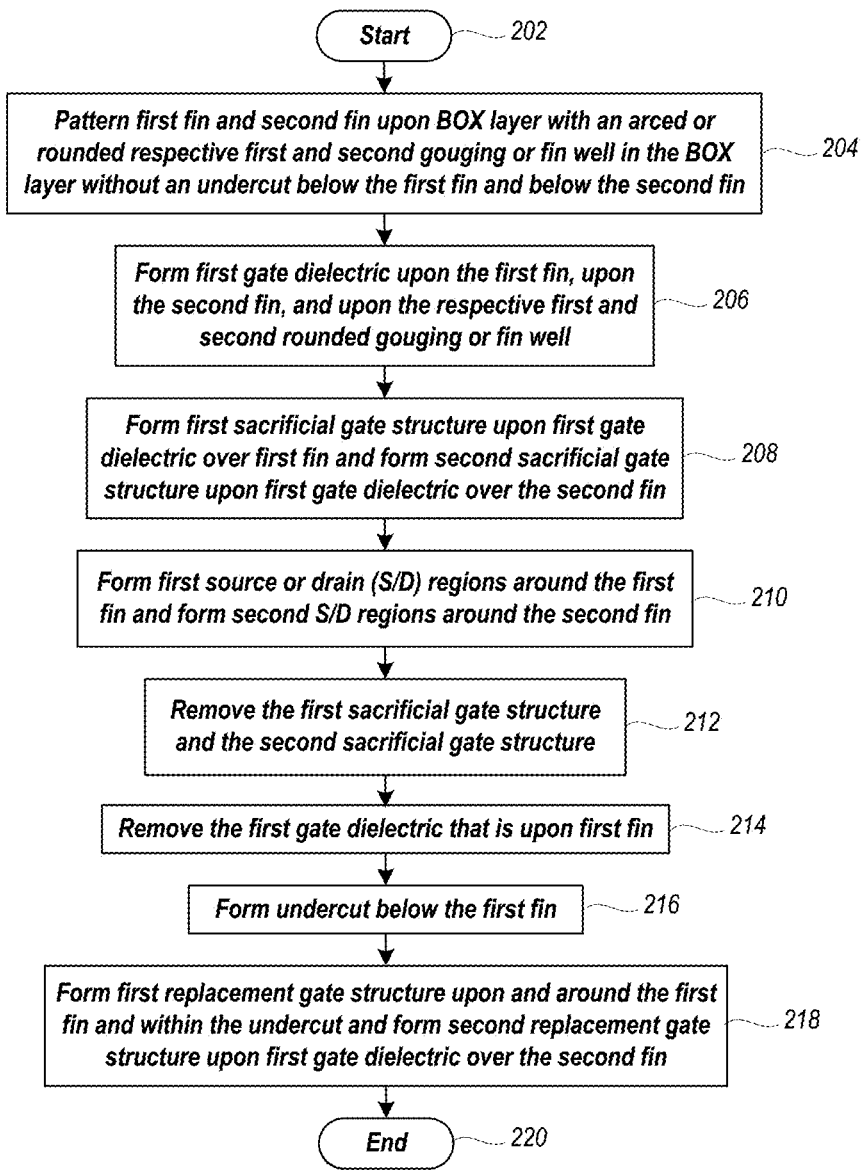
FIG. 15 is a flow diagram illustrating a semiconductor device fabrication method, in accordance with one or more embodiments.

FIG. 14 depicts cross-sectional views of a semiconductor device 100 shown after a fabrication operation, in accordance with one or more embodiments. The current fabrication operation may form replacement gate structure 194 of short channel FET 10 and replacement gate structure 195 of long channel FET 20.

Each replacement gate structure 194 can comprise a gate dielectric 190 and gate conductor(s) 192. Gate dielectric 190 can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric 190 material can be formed by any suitable deposition process or the like. In some embodiments, the gate dielectric 190 has a thickness ranging from 1 nm to 5 nm, although less thickness and greater thickness are also conceived.

Gate dielectric 190 may be formed upon gate dielectric 191 and upon the inner facing sidewalls of spacer 150. Gate dielectric 191 may be formed by known deposition techniques such PVD, CVD, ALD, or the like.

Each replacement gate structure 195 can comprise a gate dielectric 191 and gate conductor(s) 193. Gate dielectric 191 can comprise any dielectric material as described with reference to gate dielectric 190 and the listing of such material(s) is not repeated here. Gate dielectric 191 may be the same layer, same material, etc. as gate dielectric 190, may be simultaneously formed therewith, and/or may be formed prior or subsequent thereto. Gate dielectric 191 may be a different layer, different material, etc. as gate dielectric 190 and may be formed prior or subsequent thereto.

Gate dielectric 190 may be formed upon and around fin 34, upon BOX layer 104, and upon inner facing sidewalls of spacer 150. For example, gate dielectric 190 may be formed upon the top surface, sidewall or side surfaces, and upon the exposed portion(s) of the bottom surface of fin 34 within short channel FET 10. Gate dielectric 190 may be formed by known deposition techniques such PVD, CVD, ALD, or the like.

Gate conductor 192 and/or gate conductor 193 is formed upon gate dielectric 190 and upon gate dielectric 191, respectively. Gate conductor 192 and/or gate conductor 193 can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, ALD, CVD, PVD, sputtering, plating, evaporation, ion beam deposition, electron beam deposition, laser assisted deposition, chemical solution deposition, etc.

For clarity, one or more replacement gate structure 194 may be omega shaped due to undercut 182 that exposes one or more portion(s) of the bottom surface of fin 34. In other words, one or more materials associated with replacement gate structure 194 may be formed at least upon the one or more exposed portion(s) of the bottom surface of fin 34. For example, gate dielectric 190 is formed upon the one or more exposed portion(s) of the bottom surface of fin 34, that are exposed by undercut 182, and is further formed upon the side surfaces, and/or top surface, of fin 34.

For clarity, due to the both gate dielectric 131 and gate dielectric 192, the distance between gate conductor(s) 193 and the fin 34 within the long channel FET 20 is greater than a distance between gate conductor(s) 192 and the fin 34 within the short channel FET 10 (e.g., only the single gate dielectric 190 may be present between the gate conductor(s) 192 and the fin 34 within the short channel FET 10). Further for clarity, the first gate dielectric 131 within long channel FET 20 may be present solely upon the fins 34, therein, and may not be present on the sidewalls of gate spacer 150.

FIG. 14 depicts a flow diagram illustrating a method 200 of fabricating the semiconductor structure 100, according to one or more embodiments of the present invention. Method 200 may begin at block 202 and continue with forming or patterning a first fin 34 within short channel FET 10 and a second fin 32 within long channel FET 20 upon BOX layer 104, with forming a first rounded or arced gouge or fin well 36 in the BOX layer 104 outside and substantially adjoining the footprint of the first fin 34 and with forming a second rounded or arced gouge or fin well 36 in the BOX layer 104 outside and substantially adjoining the footprint of the second fin 34 without an undercut below the first fin 34 and within an undercut below the second fin 34 (block 204).

Method 200 may continue with forming a first gate dielectric upon the first fin 34, upon the second fin 34, and upon the first rounded or arced gouge or fin well 36 and upon the second rounded or arced gouge or fin well 36 (block 206). For example, gate dielectric 130 is formed upon and around the first fin 34 and gate dielectric 131 is formed upon and around second fin 34. Gate dielectric 130 and gate dielectric 131 may be formed from the same gate dielectric layer 120 and may be the same material. Alternatively, gate dielectric 130 and gate dielectric 131 may be formed in different fabrication stages and may be the same or different materials.

Method 200 may continue with forming a first sacrificial gate structure 128 upon the first gate dielectric 130 over the first fin 34 and with forming a second sacrificial gate structure 129 upon the second gate dielectric 131 over the second fin 34 (block 208).

Method 200 may continue with forming first S/D regions 140 around the first fin 34 and forming second S/D regions 140 around the second fin 34 (block 210) and removing the first sacrificial gate structure 128 and removing the second sacrificial gate structure 129 (block 212).

Method 200 may continue with removing the first gate dielectric 130 that is upon the first fin 34 (block 216) and forming undercut 182 below the first fin 34. The undercut 182 exposes a portion(s) of the bottom surface of the first fin 34.

Method 200 may continue with forming a first replacement gate structure 194 upon and around the first fin 34 and within the undercut 182, such that the first replacement gate structure 194 contacts the exposed portion(s) of the bottom surface of the first fin and forming a second replacement gate structure 195 upon the first gate dielectric 131 over the second fin 34.

The method flow diagram depicted herein is exemplary. There can be many variations to the diagram or operations described therein without departing from the spirit of the embodiments. For instance, the operations can be performed in a differing order, or operations can be added, deleted or modified. All of these variations are considered a part of the claimed embodiments.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

The invention claimed is:

1. An integrated short channel omega gate FinFET and long channel FinFET semiconductor device comprising:
   a long channel FinFET fin upon a buried oxide (BOX) layer;
   a pair of long channel FinFET fin wells within the BOX layer, the pair of long channel FinFET fin wells forms a respective first horizontally orientated elliptical BOX layer surface that adjoins a perimeter footprint of the long channel FinFET fin;
   a first long channel FinFET gate dielectric layer upon the long channel FinFET fin and within the pair of long channel FinFET fin wells;
   a long channel FinFET replacement gate structure around the long channel FinFET fin;
   a short channel FinFET fin upon the BOX layer;

a pair of short channel FinFET fin wells, each short channel FinFET fin well forms a respective second horizontally orientated elliptical BOX layer surface inset under the short channel FinFET fin by an undercut within the pair of short channel finFET fin wells that defines a BOX layer short channel pillar portion and exposes a portion of a bottom surface of the short channel FinFET; and a short channel FinFET replacement gate structure around the short channel FinFET fin.

2. The integrated short channel omega gate FinFET and long channel (Original) FinFET semiconductor device of claim 1, wherein the long channel FinFET replacement gate structure comprises a second long channel FinFET gate dielectric layer directly upon the first long channel FinFET gate dielectric layer.

3. The integrated short channel omega gate FinFET and long channel FinFET semiconductor device of claim 2, wherein BOX layer short channel pillar portion is centrally aligned to the short channel FinFET fin.

4. The integrated short channel omega gate FinFET and long channel FinFET semiconductor device of claim 3, wherein the second long channel FinFET gate dielectric layer is further directly upon respective inner sidewall(s) of a long channel FinFET gate spacer.

5. The integrated short channel omega gate FinFET and long channel FinFET semiconductor device of claim 4, wherein the short channel FinFET replacement gate structure comprises a short channel FinFET gate dielectric layer directly upon and around the short channel FinFET fin, directly upon the pair of short channel FinFET fin wells, and directly upon the BOX layer pillar portion.

6. The integrated short channel omega gate FinFET and long channel FinFET semiconductor device of claim 5, wherein the short channel FinFET gate dielectric layer is further directly upon respective inner sidewall(s) of a short channel FinFET gate spacer.

7. The integrated short channel omega gate FinFET and long channel FinFET semiconductor device of claim 1, wherein the pair of long channel FinFET fin wells define a BOX layer long channel pillar portion that has a horizontal width underneath the long channel FinFET fin that is greater than a horizontal width of the BOX layer short channel pillar portion underneath the short channel FinFET fin.

8. A semiconductor device comprising:
a first fin upon a buried oxide (BOX) layer and first fin wells within the BOX layer that form respective first horizontally orientated elliptical BOX layer surfaces that adjoin a perimeter footprint of the first fin and that defines a first BOX layer pillar portion underneath the first fin;
a second fin upon the BOX layer and second fin wells within the BOX layer that form respective second horizontally orientated elliptical BOX layer surfaces that are inset underneath the second fin by an undercut within second fin wells and that defines second BOX layer pillar portion underneath the second fin and exposes a portion of a bottom surface of the second fin;
a omega-gate upon an upper surface of the first fin, upon a first sidewall of the first fin, upon a second opposing sidewall of the first fin, and upon a portion of a bottom surface of the first fin that is exposed by the undercut; and
a tri-gate upon an upper surface of the second fin, upon a first sidewall of the second fin, and upon a second opposing sidewall of the second fin.

9. The semiconductor device of claim 8, wherein the second BOX layer pillar portion is centrally aligned with the second fin.

10. The semiconductor device of claim 9, wherein the tri-gate comprises a first tri-gate dielectric layer upon the second fin and within the second fin wells and a second tri-gate dielectric layer upon the first tri-gate dielectric layer.

11. The semiconductor device of claim 10, wherein the omega-gate comprises a omega-gate dielectric layer upon and around the first fin, upon and within the first fin wells, and upon the second BOX layer pillar portion.

12. The semiconductor device of claim 11, wherein the second tri-gate dielectric layer is further upon inner sidewall(s) of a tri-gate spacer and wherein the omega-gate dielectric layer is further upon inner sidewall(s) of a omega-gate spacer.

13. The semiconductor device of claim 12, wherein the first BOX layer pillar portion is centrally aligned to the first fin.

14. The semiconductor device of claim 13, wherein a length of a channel region of the second fin associated with the tri-gate is greater than a length of a channel region of the first fin associated with the omega-gate.

15. The semiconductor device of claim 14, wherein a distance between the tri-gate and the second fin is greater than a distance between the omega-gate and the first fin.

16. The semiconductor device of claim 8, wherein first BOX layer pillar portion has a horizontal width that is greater than a horizontal width of the second BOX layer pillar portion.

17. A semiconductor device fabrication method comprising:
forming a first fin and second fin upon a buried oxide (BOX) layer;
forming a first pair of fin wells within the BOX layer, each of the first pair of fin wells forms a respective first horizontally orientated elliptical BOX layer surface that adjoins a perimeter footprint of the first fin and forms a first BOX layer pillar portion underneath the first fin;
forming a second pair of fin wells within the BOX layer, each of the second pair of fin wells forms a respective second horizontally orientated elliptical BOX layer surface that adjoins a perimeter footprint of the second fin and forms a second BOX layer pillar portion underneath the second fin;
forming a first gate dielectric upon the first fin, upon the first pair of fin wells, upon the second fin, and upon the second pair of fin wells;
removing the first gate dielectric that is upon the first fin and that is upon the first pair of fin wells, while retaining the first gate dielectric that is upon the second fin and that is upon the second pair of fin wells;
forming an undercut within the BOX layer below the first fin thereby decreasing a horizontal width of the first BOX layer pillar portion; and
forming a omega-gate structure upon and around the first fin and upon the first BOX layer pillar portion; and
forming a tri-gate structure upon the first gate dielectric over the second fin and upon the second BOX layer pillar portion.

18. The semiconductor device fabrication method of claim 17, wherein forming the tri-gate structure comprises:
forming a tri-gate dielectric layer directly upon the first gate dielectric layer; and
forming a conductive tri-gate directly upon the tri-gate dielectric layer.

19. The semiconductor fabrication method of claim 18, wherein the first BOX layer pillar portion is centrally aligned to the first fin.

* * * * *